United States Patent
Sakaniwa et al.

(10) Patent No.: US 12,133,338 B2
(45) Date of Patent: Oct. 29, 2024

(54) INSULATED CIRCUIT SUBSTRATE MANUFACTURING METHOD

(71) Applicant: MITSUBISHI MATERIALS CORPORATION, Tokyo (JP)

(72) Inventors: Yoshiaki Sakaniwa, Saitama (JP); Toyo Ohashi, Saitama (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 224 days.

(21) Appl. No.: 17/913,212

(22) PCT Filed: Mar. 24, 2021

(86) PCT No.: PCT/JP2021/012169
§ 371 (c)(1),
(2) Date: Sep. 21, 2022

(87) PCT Pub. No.: WO2021/193701
PCT Pub. Date: Sep. 30, 2021

(65) Prior Publication Data
US 2023/0127557 A1    Apr. 27, 2023

(30) Foreign Application Priority Data
Mar. 25, 2020    (JP) .................................. 2020-053650

(51) Int. Cl.
*H05K 1/02*        (2006.01)
*H01L 21/48*       (2006.01)
(Continued)

(52) U.S. Cl.
CPC ........... *H05K 3/44* (2013.01); *H01L 21/4846* (2013.01); *H05K 1/03* (2013.01); *H05K 3/0061* (2013.01);
(Continued)

(58) Field of Classification Search
CPC .......... H05K 1/02; H05K 1/03; H05K 3/0061; H05K 3/10; H05K 3/20; H05K 3/44;
(Continued)

(56) References Cited

U.S. PATENT DOCUMENTS 5,325,583 A * 7/1994 Shimizu ............... H05K 3/4617
156/303.1
5,562,971 A * 10/1996 Tsuru ..................... H01L 24/49
428/209

(Continued)

FOREIGN PATENT DOCUMENTS

JP    H09-135057 A    5/1997
JP    2013-069767 A    4/2013
(Continued)

OTHER PUBLICATIONS

International Search Report mailed May 25, 2021, issued for PCT/JP2021/012169 and English translation thereof.
(Continued)

*Primary Examiner* — Xiaoliang Chen
(74) *Attorney, Agent, or Firm* — Locke Lord LLP

(57) ABSTRACT

An insulated circuit substrate manufacturing method of the present invention includes a metal piece disposing step of disposing the metal piece in a circuit pattern shape on a resin material serving as the insulating resin layer and a bonding step of bonding the insulating resin layer and the metal piece by pressurizing and heating the resin material and the metal piece at least in a laminating direction. In the bonding step, the metal piece and the resin material are pressurized in the laminating direction by a pressurizing jig that includes a cushion material disposed on a side of the metal piece and a guide wall portion disposed at a position facing a peripheral portion of the cushion material, and the peripheral portion of the cushion material is brought into contact with the guide wall portion during pressurization.

7 Claims, 6 Drawing Sheets

(51) Int. Cl.
*H05K 1/03* (2006.01)
*H05K 3/10* (2006.01)
*H05K 3/20* (2006.01)
*H05K 3/44* (2006.01)
*H05K 3/00* (2006.01)

(52) U.S. Cl.
CPC ....... *H05K 3/20* (2013.01); *H05K 2201/0154* (2013.01); *H05K 2201/0162* (2013.01)

(58) Field of Classification Search
CPC .. H05K 3/4084; H05K 3/4617; H05K 3/4623; H05K 3/4626; H05K 3/4632; H05K 3/4635; H05K 3/4688; H05K 3/4697; H05K 9/0024; H05K 9/0084; H05K 2201/0154; H05K 2201/0162; H01L 21/4846; H01L 21/4857; H01L 23/145; H01L 23/5383; H01L 23/49822
USPC .......... 174/255, 256; 29/730, 745, 846, 853; 156/60, 85, 261, 298, 303.1
See application file for complete search history.

(56) References Cited

U.S. PATENT DOCUMENTS

| | | | |
|---|---|---|---|
| 2004/0075988 A1 | 4/2004 | Tatsumi et al. | |
| 2007/0154799 A1* | 7/2007 | Yoon | H01M 50/256 29/730 |
| 2008/0070333 A1 | 3/2008 | Morita et al. | |
| 2010/0294559 A1* | 11/2010 | Izawa | H05K 9/0024 156/60 |
| 2012/0319337 A1* | 12/2012 | Kato | F16F 1/3863 267/141 |
| 2017/0144246 A1 | 5/2017 | Bogen et al. | |

FOREIGN PATENT DOCUMENTS

| | | |
|---|---|---|
| JP | 2015-207666 A | 11/2015 |
| JP | 2018-147934 A | 9/2018 |
| JP | 2019-096827 A | 6/2019 |

OTHER PUBLICATIONS

Supplementary European Search Report mailed Feb. 22, 2024, issued for European Patent Application No. 21774126.3.

* cited by examiner

INSULATED CIRCUIT SUBSTRATE MANUFACTURING METHOD

TECHNICAL FIELD

The present invention relates to an insulated circuit substrate manufacturing method, where an insulated circuit substrate includes an insulating resin layer and a circuit layer consisting of a metal piece arranged in a circuit pattern shape on one surface of the insulating resin layer.

Priority is claimed on Japanese Patent Application No. 2020-053650, filed Mar. 25, 2020, the content of which is incorporated herein by reference.

BACKGROUND ART

A power module, an LED module, and a thermoelectric module have a structure in which a power semiconductor element, an LED element, and a thermoelectric element are bonded to the insulated circuit substrate in which a circuit layer made of a conductive material is formed on one surface of an insulating layer.

As the above-described insulated circuit substrate, for example, a metal-based circuit substrate disclosed in Patent Document 1 has been proposed.

In the metal-based circuit substrate disclosed in Patent Document 1, the insulating resin layer is formed on a metal substrate, and the circuit layer having a circuit pattern is formed on the insulating resin layer. Here, the insulating resin layer is made of an epoxy resin which is the thermosetting resin, and the circuit layer is made of a copper foil.

In the metal-based circuit substrate, the semiconductor element is bonded onto the circuit layer, and a heat sink is arranged on a surface of the metal substrate opposite to the insulating resin layer, and heat generated by the semiconductor element is transmitted to the heat sink side and is dissipated.

Then, in the metal-based circuit substrate disclosed in Patent Document 1, a circuit pattern is formed by etching the copper foil arranged on the insulating resin layer.

Recently, the current applied to the semiconductor element mounted on the circuit layer has been increasing, and thereby, the amount of heat generated from the semiconductor element has also increased. Accordingly, in order to secure conductivity and thermal conductivity, the circuit layer has been thickened. Here, in a case where the circuit layer is thickened, there is a risk that sagging is generated on an end surface of the circuit layer, an electric field is concentrated on the end surface of the circuit layer, and thus there is a risk that insulating properties are reduced, in a case where the circuit pattern is formed by etching as disclosed in Patent Document 1.

Accordingly, as a method of forming the circuit layer without etching, Patent Document 2 proposes a technique in which a punched metal piece having a desired shape is bonded to a ceramic substrate. According to the method, even in a case where the circuit layer is thickened, sagging is not generated on an end surface of the metal piece, and the insulating properties between the circuit patterns can be secured. Therefore, the distance between the circuit patterns can be reduced.

In this Patent Document 2, the ceramic substrate is used as the insulating layer, and the metal piece is bonded to the ceramic substrate by pressurizing the metal piece to the ceramic substrate in a laminating direction.

CITATION LIST

Patent Documents

[Patent Document 1]
  Japanese Unexamined Patent Application, First Publication No. 2015-207666
[Patent Document 2]
  Japanese Unexamined Patent Application, First Publication No. H09-135057

SUMMARY OF INVENTION

Technical Problem

In Patent Document 2, in a case where the insulating layer is composed of the insulating resin layer made of the thermosetting resin, the metal piece is disposed on the resin composition before curing, and the metal piece is pressurized and heated in the laminating direction, whereby the resin composition is cured to constitute the insulating resin layer and the insulating resin layer and the metal piece are bonded to each other. Here, in a case where the circuit layer is thickened, the resin composition is sufficiently pressurized in a region where the metal piece is disposed. However, in a region where the metal piece is not disposed, the pressurization of the resin composition is insufficient, and a large number of voids are generated inside the insulating resin layer, and thus there is a risk that the insulating properties of the insulating resin layer cannot be secured. As a result, in the insulated circuit substrate using an insulating resin layer, it is difficult to accurately form the thickened circuit layer.

Accordingly, it is conceivable that a metal piece is disposed in a circuit pattern shape on one surface of a resin composition consisting of a thermosetting resin, and a rubber-like elastic body is disposed on a side of the metal piece to pressurize and heat the resin composition and the metal piece in a laminating direction to cure the resin composition, thereby forming the insulating resin layer and bonding the insulating resin layer and the metal piece to each other.

However, in a case where the rubber-like elastic body is disposed on a side of the metal piece and the resin composition and the metal piece are pressed in the laminating direction, the peripheral portion of the rubber-like elastic body is deformed to spread outward due to pressurization when the metal piece is pressed with the rubber-like elastic body, and thus there was a risk that the metal piece is shifted in a direction in which the peripheral portion spreads outward or that a region corresponding to the peripheral portion of the rubber-like elastic body cannot be sufficiently pressurized, and the defective bonding of the metal piece and the breaking of the insulating resin layer occur.

The present invention has been made in consideration of the above-described circumstances, and an object of the present invention is to provide an insulated circuit substrate manufacturing method with which an entire resin material can be uniformly pressurized, and an insulating resin layer and a metal piece can be reliably bonded to each other even in a case where the metal piece is disposed in a circuit pattern shape on the resin material.

Solution to Problem

In order to solve the above-described problems, a manufacturing method for an insulated circuit substrate of the present invention is characterized by being an insulated circuit substrate manufacturing method in which an insulated circuit substrate includes an insulating resin layer and a circuit layer consisting of a metal piece arranged in a circuit pattern shape on one surface of the insulating resin layer, the manufacturing method for the insulated circuit substrate including: a metal piece disposing step of disposing the metal piece to form a circuit pattern shape on a resin material to be the insulating resin layer; and a bonding step of bonding the insulating resin layer and the metal piece by pressurizing and heating the resin material and the metal piece at least in a laminating direction, in which the bonding step, the metal piece and the resin material are pressurized in the laminating direction by a pressurizing jig that includes a cushion material disposed on a side of the metal piece and a guide wall portion disposed at a position facing a peripheral portion of the cushion material, and the peripheral portion of the cushion material is brought into contact with the guide wall portion during pressurization.

According to the insulated circuit substrate manufacturing method having this configuration, in the bonding step, the metal piece and the resin material are pressurized in the laminating direction by a pressurizing jig that includes a cushion material disposed on the metal piece side and a guide wall portion disposed at a position facing a peripheral portion of the cushion material, and the peripheral portion of the cushion material is brought into contact with the guide wall portion during pressurization. As a result, in the bonding step, the guide wall portion suppresses the outward protrusion of the peripheral portion of the cushion material, whereby the resin material can be sufficiently pressurized in all of a region where the metal piece is disposed, a region where the metal piece is not disposed, and a region corresponding to the peripheral portion of the cushion material, and it is possible to firmly bond the metal piece and the insulating resin layer to each other. Regarding the contact between the peripheral portion of the cushion material and the guide wall portion, it suffices that they are in contact at least during pressurization, and they may be in contact before pressurization. Further, in a case where the peripheral portion of the cushion material is brought into contact with the guide wall portion, the lower surface side of the peripheral portion of the cushion material may come into contact with the guide wall portion, or the side surface side of the peripheral portion of the cushion material may come into contact with the guide wall portion.

Here, in the insulated circuit substrate manufacturing method of the present invention, it is preferable that the hardness of the guide wall portion is larger than the hardness of the cushion material.

In this case, since the hardness of the guide wall portion is larger than the hardness of the cushion material, it is possible to reliably suppress the deformation of the peripheral portion of the cushion material during pressurization.

Further, in the insulated circuit substrate manufacturing method of the present invention, it is preferable that the guide wall portion is arranged on a side of the resin material of the pressurizing jig.

In this case, since the guide wall portion is arranged on a side of the resin material of the pressurizing jig, the guide wall portion is reliably brought into contact with the peripheral portion of the cushion material arranged on one side of the metal piece during pressurization, and it is possible to reliably suppress the deformation of the peripheral portion of the cushion material during pressurization.

Further, in the insulated circuit substrate manufacturing method of the present invention, the insulated circuit substrate further includes a heat dissipation layer disposed on the other surface of the insulating resin layer, and in the bonding step, the metal piece and the insulating resin layer, and the heat dissipation layer and the insulating resin layer are bonded to each other at the same time.

In this case, a heat dissipation layer can be formed at the same time as the circuit layer on the other surface side of the insulating resin layer, and it is possible to efficiently manufacture an insulated circuit substrate having excellent heat dissipation.

Further, in the insulated circuit substrate manufacturing method of the present invention, the resin material is an epoxy resin, and in the bonding step, the resin material is cured to form the insulating resin layer.

In this case, in the bonding step, the resin material consisting of an epoxy resin can be sufficiently pressurized in all of a region where the metal piece is disposed, a region where the metal piece is not disposed, and a region corresponding to the peripheral portion of the cushion material, and it is possible to carry out curing uniformly, whereby it is possible to form an insulating resin layer having excellent insulating properties.

Further, in the insulated circuit substrate manufacturing method of the present invention, the resin material may be a polyimide resin.

In this case, in the bonding step, the resin material consisting of a polyimide resin can be sufficiently pressurized in all of a region where the metal piece is disposed, a region where the metal piece is not disposed, and a region corresponding to the peripheral portion of the cushion material, and it is possible to reliably bond the insulating resin layer and the metal piece to each other.

Further, in the insulated circuit substrate manufacturing method of the present invention, it is preferable that the cushion material is made of silicone rubber.

In this case, the cushion material has a proper hardness, and thus it can be deformed according to the shape of the metal piece and can be uniformly pressed in a region where the metal piece is disposed, a region where the metal piece is not disposed, and a region corresponding to the peripheral portion of the cushion material.

Advantageous Effects of Invention

According to the present invention, it is possible to provide an insulated circuit substrate manufacturing method with which an entire resin material can be uniformly pressurized, and an insulating resin layer and a metal piece can be reliably bonded to each other even in a case where the metal piece is disposed in a circuit pattern shape on the resin material.

DESCRIPTION OF EMBODIMENTS

Hereinafter, embodiments of the present invention will be described with reference to the accompanying drawings.

Figure 1:
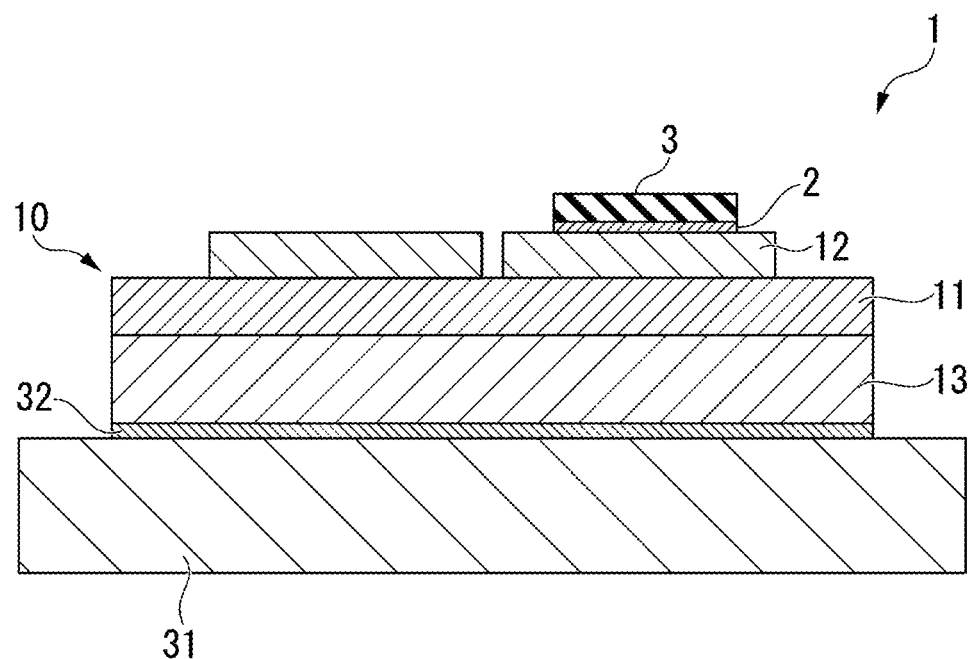
FIG. 1 is a cross-sectional explanatory view of a power module using an insulated circuit substrate which is manufactured according to an insulated circuit substrate manufacturing method according to an embodiment of the present invention.

FIG. 1 shows an insulated circuit substrate 10 in an embodiment of the present invention and a power module 1 using the insulated circuit substrate 10.

The power module 1 includes the insulated circuit substrate 10, a semiconductor element 3 bonded to one side (the upper side in FIG. 1) of the insulated circuit substrate 10 via a solder layer 2, and a heat sink 31 bonded to the other side (the lower side in FIG. 1) of the insulated circuit substrate 10 via a solder layer 32.

The solder layers 2 and 32 are, for example, Sn—Ag-based, Sn—Cu-based, Sn—In-based, or Sn—Ag—Cu-based solder materials (so-called lead-free solder materials).

The semiconductor element 3 is an electronic component including a semiconductor, and various semiconductor elements are selected according to a required function.

Figure 2A:
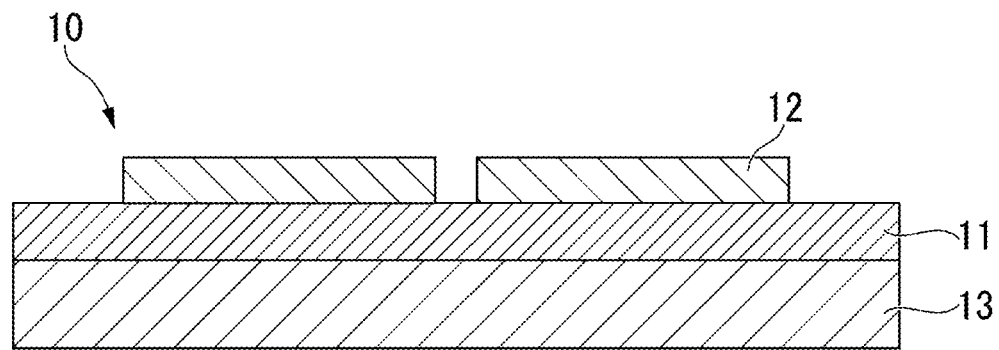
FIG. 2A is a side surface cross-sectional view of the insulated circuit substrate which is manufactured according to the insulated circuit substrate manufacturing method according to the embodiment of the present invention.
Figure 2B:
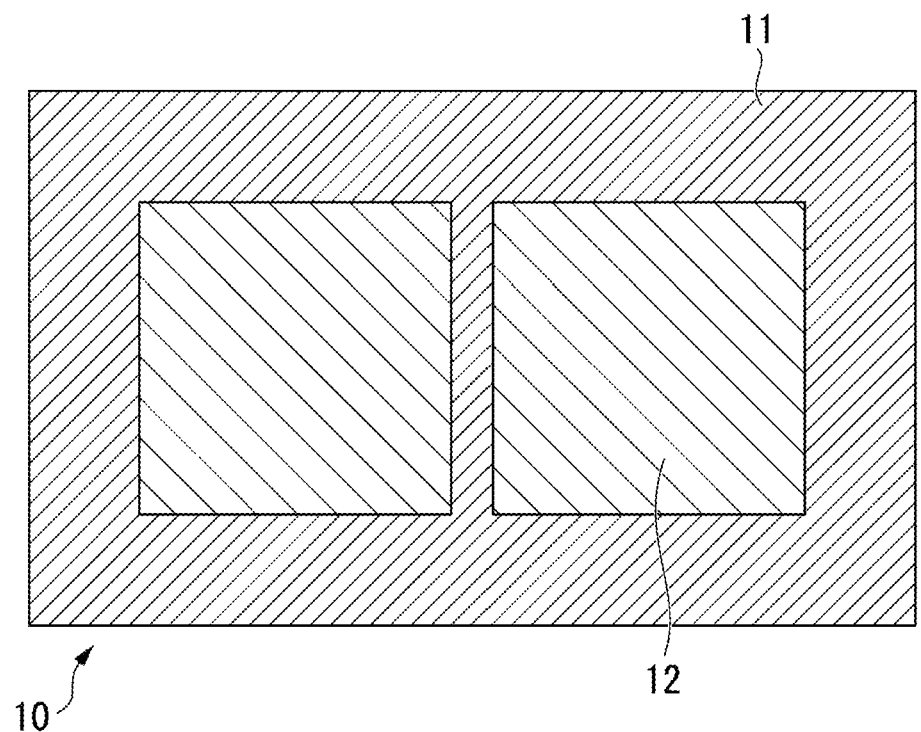
FIG. 2B is a top view of the insulated circuit substrate manufactured according to the insulated circuit substrate manufacturing method according to the embodiment of the present invention.

As shown in FIG. 1 and FIG. 2A, the insulated circuit substrate 10 includes an insulating resin layer 11, a circuit layer 12 formed on one surface (the upper surface in FIGS. 1 and 2A) of the insulating resin layer 11, and a heat dissipation layer 13 formed on the other surface (the lower surface in FIG. 1 and FIG. 2A) of the insulating resin layer 11.

The insulating resin layer 11 prevents electrical connection between the circuit layer 12 and the heat dissipation layer 13 and is made of a resin having insulating properties. In the present embodiment, a thermosetting resin containing an inorganic filler is used in order to secure the strength of the insulating resin layer 11.

Here, as the inorganic filler, for example, alumina, boron nitride, aluminum nitride, and the like can be used. In addition, as the thermosetting resin, an epoxy resin, a polyimide, or the like can be used.

In the present embodiment, the insulating resin layer 11 is made of an epoxy resin containing alumina as an inorganic filler. Further, the thickness of the insulating resin layer 11 is set within a range of 20 μm or more and 250 μm or less. In the insulating resin layer 11, there is almost no difference between the thickness of a portion in contact with the circuit layer 12 and the thickness of a portion other than the above portion, and the thickness of the insulating resin layer 11 is suppressed to 20% or less of the thickness of the portion in contact with the circuit layer 12.

Figure 5:
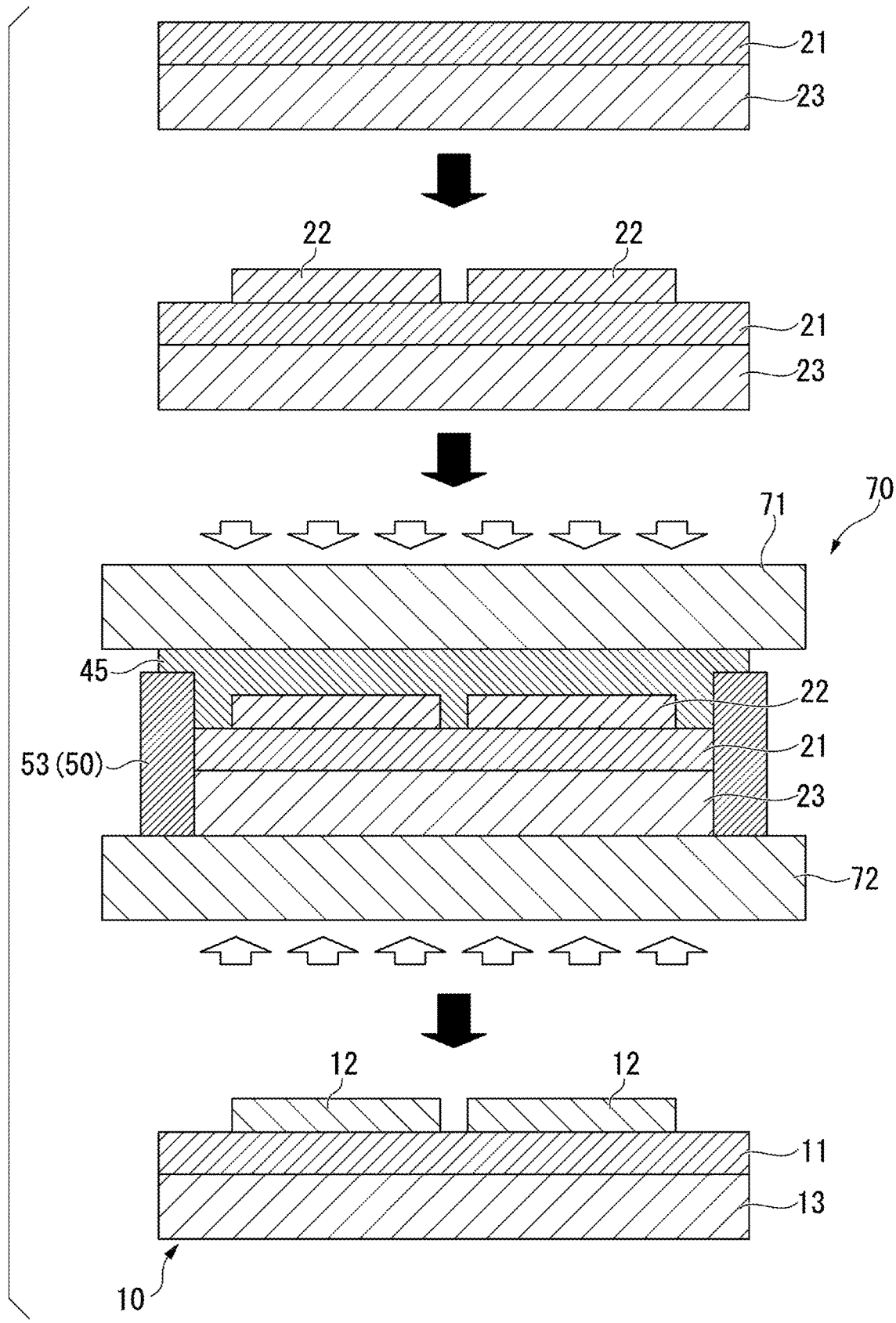
FIG. 5 is an explanatory view showing an example of the insulated circuit substrate manufacturing method according to the embodiment of the present invention.

As shown in FIG. 5, the circuit layer 12 is formed by bonding the metal piece 22 made of a metal having excellent conductivity to one surface (the upper surface in FIG. 5) of the insulating resin layer 11. As the metal piece 22, the metal piece formed by punching a metal plate can be used. In the present embodiment, as the metal piece 22 constituting the circuit layer 12, a metal piece formed by punching a rolled plate of an oxygen-free copper is used.

In the circuit layer 12, a circuit pattern is formed by disposing the metal piece 22 in a circuit pattern shape, and one surface (the upper surface in FIG. 1) of the circuit pattern is a mounting surface on which the semiconductor element 3 is mounted.

Here, the thickness t of the circuit layer 12 (metal piece 22) is 0.5 mm or more. It is noted that the thickness t of the circuit layer 12 (metal piece 22) is preferably 1.0 mm or more, and more preferably 1.5 mm or more. In addition, the upper limit of the thickness t of the circuit layer 12 (metal piece 22) is not particularly limited, but in reality, it is 3.0 mm or less.

The closest distance L between the metal pieces 22 arranged in a circuit pattern shape is preferably set such that the ratio L/t to the thickness t of the metal piece 22 arranged in a circuit pattern shape is 2.0 mm or less. L/t is preferably within a range in which the cushion material comes into contact with the resin composition 21 when the cushion material is disposed on a side of the metal piece 22 and the cushion material is pressed on a side of the resin composition 21, specifically 1.0 mm or less, and more preferably 0.5 mm or less.

Specifically, in the present embodiment, the closest distance L between the metal pieces 22 arranged in a circuit pattern shape is within a range of 1.0 mm or more and 1.5 mm or less.

The heat dissipation layer 13 has an effect of improving the heat dissipation characteristics by spreading heat generated in the semiconductor element 3 mounted on the insulated circuit substrate 10 in the surface direction. Therefore, the heat dissipation layer 13 is made of a metal having exceptional thermal conductivity, for example, a copper or a copper alloy, an aluminum or an aluminum alloy. In the present embodiment, it is made of the rolled plate of the oxygen-free copper. In addition, the thickness of the heat dissipation layer 13 is within a range of 0.05 mm or more and 3 mm or less.

The heat sink 31 is for dissipating heat on the side of the insulated circuit substrate 10. The heat sink 31 is made of copper or a copper alloy, aluminum, an aluminum alloy, or the like having good thermal conductivity. In the present embodiment, a heat dissipation plate is made of the oxygen-free copper. The thickness of the heat sink 31 is within a range of 3 mm or more and 10 mm or less.

Here, the heat dissipation layer 13 of the insulated circuit substrate 10 and the heat sink 31 are bonded via the solder layer 32.

Figure 3:
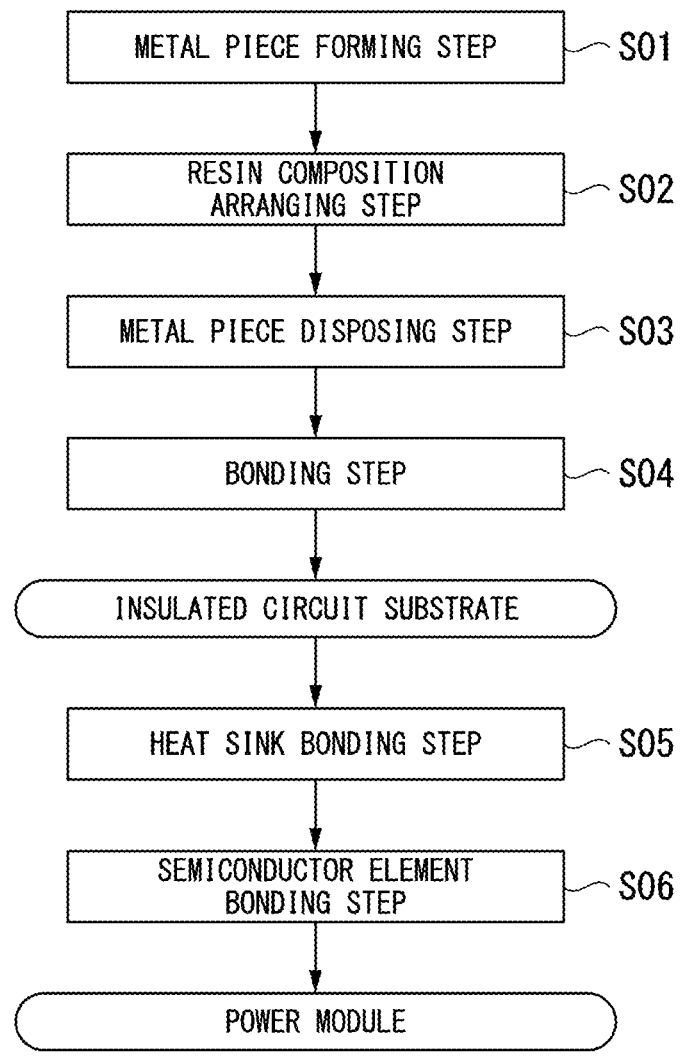
FIG. 3 is a flowchart showing an example of the insulated circuit substrate manufacturing method according to the embodiment of the present invention.
Figure 4:
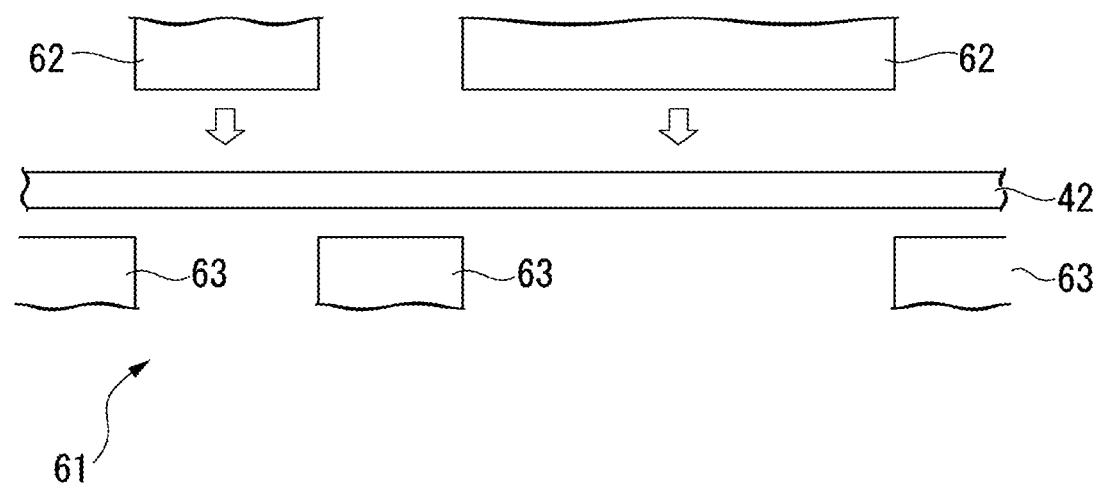
FIG. 4 is an explanatory view showing a metal piece forming step in FIG. 3.

Hereinafter, a manufacturing method for the insulated circuit substrate 10 according to the present embodiment will be described with reference to FIG. 3 to FIG. 5.

(Metal Piece Forming Step S01)

First, the metal piece 22 serving as the circuit layer 12 is formed. The metal plate 42 (the rolled plate of the oxygen-free copper in the present embodiment) is punched to form the metal piece 22. In the present embodiment, as shown in FIG. 4, the metal plate 42 is sandwiched and sheared by a convex type 62 and a concave type 63 of a punching machine 61. As a result, the metal piece 22 is punched out from the metal plate 42.

(Resin Composition Arranging Step S02)

Next, as shown in FIG. 5, a resin composition 21 containing alumina as an inorganic filler, an epoxy resin as a thermosetting resin, and a curing agent is arranged on one surface (the upper surface in FIG. 5) of the metal plate 23 serving as the heat dissipation layer 13.

(Metal Piece Disposing Step S03)

Next, a plurality of metal pieces 22 are disposed in a circuit pattern shape on one surface (the upper surface in FIG. 5) of the resin composition 21.

(Bonding Step S04)

Next, after disposing between the upper pressing plate 71 and the lower pressing plate 72 of the pressurizing device 70, the metal plate 23 serving as the heat dissipation layer 13, the resin composition 21, and the metal piece 22 are pressurized and heated in the laminating direction, thereby curing the resin composition 21 to form the insulating resin layer 11. At the same time, the heat dissipation layer 13 and the circuit layer 12 are formed by bonding the metal plate 23 and the insulating resin layer 11, and the insulating resin layer 11 and the metal piece 22.

In addition, in a bonding step S04 of the present embodiment, as shown in FIG. 5, a cushion material 45 is disposed on a side of the metal piece 22 (a side of the upper pressing plate 71), a receiving jig 50 including a guide wall portion 53 facing the peripheral portion of the cushion material 45 is disposed on a side of the resin composition 21 (the lower pressing plate 72), and the metal piece 22 and the resin composition 21 are pressurized in the laminating direction by the upper pressing plate 71 and the lower pressing plate 72. When pressurized, the peripheral portion of the cushion material 45 and the guide wall portion 53 of the receiving jig 50 come into contact with each other, and thus the outward protrusion of the peripheral portion of the cushion material 45 is suppressed.

Here, it is preferable that in the cushion material 45, the hardness H1 that is measured by an Asker hardness tester C type (manufactured by KOBUNSHI KEIKI Co., Ltd.) is set within a range of 10 or more and 75 or less. In the present embodiment, the cushion material 45 is made of, for example, silicone rubber, or the like.

Further, it is preferable that the hardness H2 of the receiving jig 50 (the guide wall portion 53) is set within a range of 50 HV or more and 1,000 HV or less. In the present embodiment, the receiving jig 50 is made of, for example, an aluminum alloy, carbon, or the like. It is noted that the hardness of the receiving jig is measured according to the JIS Z 2244: 2009 Vickers hardness test.

Further, as shown in FIG. 5, it is preferable that the receiving jig 50 is constituted so that the metal plate 23 serving as the heat dissipation layer 13 and the resin composition 21 are capable of being accommodated and that the height from the lower pressing plate 72 at the upper end of the guide wall portion 53 is higher than the disposition position of the metal piece 22.

Further, it is preferable that the contact width between the guide wall portion 53 and the cushion material 45 is set within a range of 1 mm or more and 20 mm or less.

In addition, in the bonding step S04, it is preferable that a heating temperature is set within a range of 120° C. or more and 350° C. or less, and a holding time at the heating temperature is set within a range of 10 minutes or more and 180 minutes or less. Further, the pressurizing load in the laminating direction is preferably set within a range of 1 MPa or more and 30 MPa or less.

Here, the lower limit of the heating temperature is more preferably 150° C. or higher, and still more preferably 170° C. or higher. On the other hand, the upper limit of the heating temperature is preferably 250° C. or lower, and more preferably 200° C. or lower.

The lower limit of the holding time at the heating temperature is preferably 30 minutes or more, and more preferably 60 minutes or more. On the other hand, the upper limit of the holding time at the heating temperature is preferably 120 minutes or less, and more preferably 90 minutes or less.

The lower limit of the pressurizing load in the laminating direction is preferably MPa or more, and more preferably 8 MPa or more. On the other hand, the upper limit of the pressurizing load in the laminating direction is preferably 15 MPa or less, and more preferably 10 MPa or less.

The insulated circuit substrate 10 according to the present embodiment is manufactured according to each of the steps described above.

(Heat Sink Bonding Step S05)

Next, the heat sink 31 is bonded to the other surface of the heat dissipation layer 13 of the insulated circuit substrate 10.

In the present embodiment, the heat dissipation layer 13 and the heat sink 31 are bonded via the solder material.

(Semiconductor Element Bonding Step S06)

Then, the semiconductor element 3 is bonded to the circuit layer 12 of the insulated circuit substrate 10. In the present embodiment, the circuit layer 12 and the semiconductor element 3 are bonded via a solder material.

According to the above steps, the power module 1 shown in FIG. 1 is manufactured.

Since the manufacturing method for the insulated circuit substrate 10 according to the present embodiment, which has the above-described configuration, has the resin composition arranging step S02, the metal piece disposing step S03, and the bonding step S04, the formation of the insulating resin layer 11 and the bonding of the metal piece 22, the insulating resin layer 11, and the metal plate 23 can be carried out at the same time, and thus the insulated circuit substrate 10 can be manufactured efficiently.

In addition, the circuit pattern can be formed without carrying out etching, the shape of the end portion of the circuit layer 12 can be formed with high accuracy, and the electric field concentration at the end portion of the bonding interface of the circuit layer 12 can be suppressed.

Further, according to the manufacturing method for the insulated circuit substrate 10 according to the present embodiment, the cushion material 45 is disposed on a side of the metal piece 22 (a side of the upper pressing plate 71), the receiving jig 50 including the guide wall portion 53 facing the peripheral portion of the cushion material is disposed on a side of the resin composition 21 (the lower pressing plate 72), and the metal piece 22 and the resin composition 21 are pressurized in the laminating direction. As a result, the peripheral portion of the cushion material 45 and the guide wall portion 53 of the receiving jig 50 come into contact with each other when pressurized, the outward protrusion of the peripheral portion of the cushion material 45 is suppressed, the resin composition 21 can be sufficiently pressurized in all of a region where the metal piece 22 is disposed, a region where the metal piece 22 is not disposed, and a region corresponding to the peripheral portion of the cushion material 45, it is possible to form the insulating resin layer 11 having excellent insulating properties, and it is possible to firmly bond the metal piece 22 and the insulating resin layer 11 to each other.

The embodiments of the present invention have been described as above; however, the present invention is not limited to this, and they can be appropriately changed without departing from the technical ideas of the present invention.

For example, it has been described in the present embodiment that a power semiconductor element is mounted on the circuit layer of the insulated circuit substrate to constitute a power module; however, the present invention is not limited to this. For example, an LED element may be mounted on an insulated circuit substrate to form an LED module, or a thermoelectric element may be mounted on a circuit layer of an insulated circuit substrate to form a thermoelectric module.

In addition, although it has been described in the present embodiment that the insulated circuit substrate (the metal substrate) and the heat sink are bonded via the solder layer, the present invention is not limited to this, and the insulated circuit substrate (the metal substrate) and the heat sink may be laminated via grease.

Further, the material and structure of the heat sink are not limited to the present embodiment, and the design may be changed as appropriate.

Although it has been described in the present embodiment that the metal piece forming step S01 of forming the metal piece 22 is provided by punching the metal plate 42, the present invention is not limited to this, and metal pieces formed by other means may be used.

Further, although it has been described in the present embodiment that in the bonding step, the metal plate is bonded together with the metal piece, and a heat dissipation layer is formed on the other surface side of the insulating resin layer. However, the present invention is not limited to this, and the heat dissipation layer may not be formed.

Figure 6:
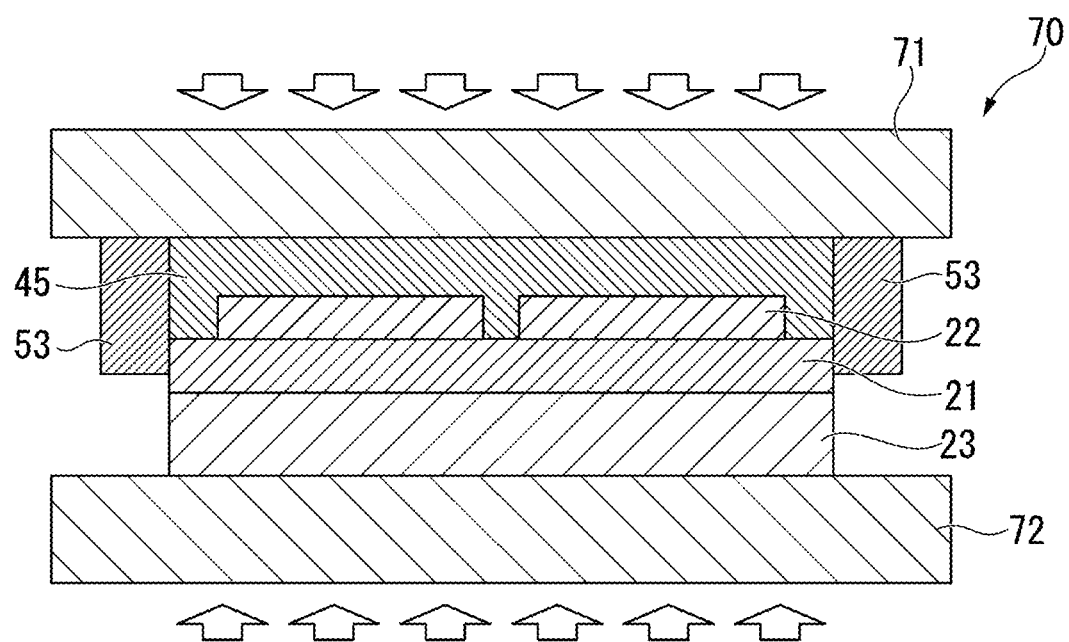
FIG. 6 is an explanatory view of a guide wall portion that is used in an insulated circuit substrate manufacturing method according to another embodiment of the present invention.

Further, although it has been described in the present embodiment as a configuration of carrying out pressurization using a receiving jig having a guide wall portion, the present invention is not limited to this, and as shown in FIG. 6, the guide wall portion 53 may be arranged on a side of the cushion material 45.

Further, although it has been described in the present embodiment that the insulating resin layer is made of an epoxy resin, the insulating resin layer may be made of a polyimide resin. In this case, in the bonding step, a polyimide resin cured in advance is laminated, and pressurized and heated to bond the metal piece and the insulating resin layer to each other.

Examples

Hereinafter, the results of confirmation experiments carried out to confirm the effects of the present invention will be described.

The rolled plate of the oxygen-free copper (OFC) (50 mm×60 mm×thickness 2.0 mm) is prepared as a metal plate serving as the heat dissipation layer, and a sheet material of the resin composition shown in Table 1 is disposed on one surface of the metal plate.

Then, the metal piece (20 mm×20 mm) shown in Table 1 was disposed in a pattern shape on one surface of the resin composition. At this time, the metal pieces are disposed so that the closest distance between the metal pieces is a value shown in Table 1.

Then, as the bonding step, the metal plate, the resin composition, and the metal piece were pressurized and heated in the laminating direction under the conditions shown in Table 2 to cure the resin composition, thereby forming the insulating resin layer and bonding the metal plate, the insulating resin layer, and the metal piece (the metal plate).

At this time, in Present Invention Examples 1 and 2, a receiving jig in which a rubber-like elastic body (thickness: 4.0 mm) consisting of silicone rubber is disposed on one side of the metal piece and a guide wall portion is provided on a side of the resin composition was disposed and pressurized in the laminating direction.

On the other hand, in Comparative Examples 1 and 2, a rubber-like elastic body (thickness: 4.0 mm) consisting of silicone rubber was disposed on one side of the metal piece, a receiving jig was not disposed on a side of the resin composition, and pressurization was carried out in the laminating direction.

The insulated circuit substrate obtained as described above was evaluated for the breaking of the insulating resin layer and the peeling of the metal piece after the thermal cycles.

The breaking of the insulating resin layer was evaluated by visually observing the insulating resin layer after the bonding step.

In addition, after carrying out the thermal cycles test (between −45° C. and 200° C., 500 cycles), the presence or absence of peeling of the metal piece was evaluated.

TABLE 1

| | Resin composition (insulating resin layer) | | | | Circuit layer (metal piece) | | |
|---|---|---|---|---|---|---|---|
| | Thermosetting resin | Inorganic filler | Thickness mm | Thermal conductivity W/(m · K) | Material | Thickness mm | Closest distance mm |
| Present Invention Example 1 | Epoxy | Al$_2$O$_3$, BN | 150 | 15 | OFC | 0.5 | 1.0 |
| Present Invention Example 2 | Polyimide | BN | 60 | 0.8 | OFC | 1.5 | 1.0 |
| Comparative Example 1 | Epoxy | Al$_2$O$_3$, BN | 150 | 15 | OFC | 0.3 | 1.0 |
| Comparative Example 2 | Polyimide | BN | 50 | 0.8 | OFC | 0.3 | 1.0 |

TABLE 2

|  | Bonding step | | | | | Receiving jig | | Evaluation | |
|---|---|---|---|---|---|---|---|---|---|
|  | Temperature | Time | Pressure | Cushion material | | Usage or | | Cracking of insulating | Peeling of metal piece after |
|  | ° C. | min | MPa | Material | Hardness | not used | Hardness | resin layer | thermal cycles |
| Present Invention Example 1 | 180 | 60 | 10 | Silicone rubber | 50 | Used | 95 | Absent | Absent |
| Present Invention Example 2 | 300 | 60 | 5 | Silicone rubber | 50 | Used | 95 | Absent | Absent |
| Comparative Example 1 | 180 | 60 | 10 | Silicone rubber | 50 | Not used | — | Present | — |
| Comparative Example 2 | 300 | 60 | 5 | Silicone rubber | 50 | Not used | — | Absent | Present |

In Comparative Example 1, an insulating resin layer was formed by using a resin sheet consisting of an epoxy resin, and a receiving jig was not used in the bonding step. Breaking was observed in the insulating resin layer after the bonding step. For this reason, the thermal cycles test was not carried out.

In Comparative Example 2, an insulating resin layer was formed by using a resin sheet consisting of a polyimide resin, and a receiving jig was not used in the bonding step. Breaking was not observed in the insulating resin layer after the bonding step, but the peeling of the metal piece was confirmed after the thermal cycles test.

On the other hand, in Present Invention Example 1, in which an insulating resin layer was formed by using a resin sheet consisting of an epoxy resin, and a receiving jig was used in the bonding step, and Comparative Example 2 in which an insulating resin layer was formed by using a resin sheet consisting of a polyimide resin, and a receiving jig was used in the bonding step, breaking was not observed in the insulating resin layer after the bonding step, and the peeling of the metal piece was not observed after the thermal cycles test.

From the above results, according to the present invention example, it was confirmed that even in a case where the metal piece is disposed in a circuit pattern shape on the resin composition, it is possible to provide an insulated circuit substrate manufacturing method with which the entire resin composition can be uniformly pressurized.

REFERENCE SIGNS LIST

1: Power module
3: Semiconductor element
10: Insulated circuit substrate
11: Insulating resin layer
12: Circuit layer
13: Heat dissipation layer
21: Resin composition
22: Metal piece
23: Metal plate
45: Cushion material
50: Receiving jig
53: Guide wall portion

What is claimed is:

1. A manufacturing method for an insulated circuit substrate including an insulating resin layer and a circuit layer consisting of a metal piece arranged in a circuit pattern shape on one surface of the insulating resin layer, the manufacturing method for the insulated circuit substrate comprising:
   a metal piece disposing step of disposing the metal piece to form a circuit pattern shape on a resin material to be the insulating resin layer; and
   a bonding step of bonding the insulating resin layer and the metal piece by pressurizing and heating the resin material and the metal piece at least in a laminating direction,
   wherein in the bonding step, the metal piece and the resin material are pressurized in the laminating direction by a pressurizing jig that includes a cushion material disposed on a side of the metal piece and a guide wall portion disposed at a position facing a peripheral portion of the cushion material, and the peripheral portion of the cushion material is brought into contact with the guide wall portion during pressurization.

2. The insulated circuit substrate manufacturing method according to claim 1,\
   wherein a hardness of the guide wall portion is larger than a hardness of the cushion material.

3. The insulated circuit substrate manufacturing method according to claim 1,
   wherein the guide wall portion is arranged on the resin material side of the pressurizing jig.

4. The insulated circuit substrate manufacturing method according to claim 1,
   wherein the insulated circuit substrate further includes a heat dissipation layer disposed on the other surface of the insulating resin layer, and
   in the bonding step, the metal piece and the insulating resin layer, and the heat dissipation layer and the insulating resin layer are bonded to each other at the same time.

5. The insulated circuit substrate manufacturing method according to claim 1,
   wherein the resin material is an epoxy resin, and
   in the bonding step, the resin material is cured to form the insulating resin layer.

6. The insulated circuit substrate manufacturing method according to claim 1, wherein the resin material is a polyimide resin.

7. The insulated circuit substrate manufacturing method according to claim 1,
   wherein the cushion material is made of silicone rubber.

* * * * *